(12) United States Patent
Hirano et al.

(10) Patent No.: US 6,172,912 B1
(45) Date of Patent: Jan. 9, 2001

(54) PROGRAMMING METHOD FOR A NONVOLATILE SEMICONDUCTOR MEMORY

(75) Inventors: Yasuaki Hirano, Yamatokoriyama; Yoshiji Ohta, Kashiwara, both of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/304,464

(22) Filed: May 3, 1999

(30) Foreign Application Priority Data

Jun. 30, 1998 (JP) .................................................. 10-184015

(51) Int. Cl.$^7$ ................................................... G11C 16/04
(52) U.S. Cl. ................................ 365/185.28; 365/185.03
(58) Field of Search ........................... 365/185.28, 185.03

(56) References Cited

U.S. PATENT DOCUMENTS

| | | | |
|---|---|---|---|
| 5,394,362 | * 2/1995 | Banks | 365/189.01 |
| 5,694,357 | * 12/1997 | Mori | 365/185.03 |
| 5,737,265 | 4/1998 | Atwood et al. . | |
| 5,754,469 | 5/1998 | Hung et al. . | |
| 5,754,475 | * 5/1998 | Bill et al. | 365/185.25 |
| 5,768,188 | * 6/1998 | Park et al. | 365/185.03 |
| 5,959,882 | * 9/1999 | Toshida et al. | 365/185.03 |
| 5,982,667 | * 11/1999 | Jyouno et al. | 365/185.22 |

FOREIGN PATENT DOCUMENTS

| | | |
|---|---|---|
| 06177397 | 6/1994 | (JP) . |
| 097383 | 10/1997 | (JP) . |
| 10-27486 | 1/1998 | (JP) . |

OTHER PUBLICATIONS

Hirano et al., (1997) "A sensing scheme for a ACT flash memory" *Technical Report of IEICE*, 37–42.

Jung et al., (1996) "TP 2.1: A 3.3V 128Mb Multi–Level NAND Flash Memory for Mass Storage Application" IEEE Internat. Solid–State Circuits Conference, 32–33.

Nobukata et al., "A 144Mb 8–Level NAND Flash Memory with Optimized Pulse Width Programming" Memory Division, Semiconductor Company, Sony Corporation, Atsugi, Kanagawa, Japan.

Ohkawa et al., (1996) "TP 2.3: A 98mm$^2$ 3.3V 64Mb Flash Memory with FN–NOR Type 4–level Cell" 1996 IEEE Internat. Solid–State Circuits Conference, 36–37.

Tanaka et al., (Jun. 1997) "A3.4 Mbyte/sec Programming 3–Level NAND Flash Memory Saving 40% Die Size Per Bit" *Sympo. on VLSI Circuits, Digiest of Technical Papers*, 65–66.

Yamauchi, et al. "A New Cell Structure for Sub–quarter Micron High Density Flash Memory" VLSI Reserach Laboratory, Sharp Corporation Ichinomoto–cho, Tenri–shi, Nara 632, Japan, IEDM 95–267 through IEDM 95–270.

* cited by examiner

*Primary Examiner*—David Nelms
*Assistant Examiner*—Connie C. Yoha
(74) *Attorney, Agent, or Firm*—Morrison & Foerster LLP

(57) ABSTRACT

A virtual ground type array has a number of electrically data-programmable, erasable memory cells, arranged matrix-wise in rows and columns. A multiple number of row lines are each connecting the control gates of memory cells located in one row and a multiple number of column lines are each commonly connecting the drain and source of memory cells constituting columns. The memory cells are programmed sequentially in the order of degree of the difference in charge amount in the floating gate from the erased state (data'00').

6 Claims, 14 Drawing Sheets

( FN-NOR type flash memory )

( Distribution of the threshold levels of an FN-NOR type flash memory )

(Multilevel data writing to an NAND type flash memory)

( Distribution of multiple threshold levels of an NAND type flash memory )

(Multilevel data writing to an ACT type flash memory based on a conventional method)

(Current path when M02 has been programmed)

(Current paths when M02 is read out with M00 and M01 being set at the low threshold level)

Change of the threshold level due to the effect of virtual ground type array $|bl| = |o1| - |a|$ Ia : Current reduction as a result of the potential rise of BL3 higher than 0V when Ij flows in (Current paths when M02 is read out with M03 and M04 being set at the low threshold level)

(Multilevel data writing to an ACT type flash memory based on a conventional method)

Current paths when M02 is read out

Ia : current reduction as a result of the potential rise
of BL3 higher than 0V when Ij flows in
Current paths when M02 is read out

PROGRAMMING METHOD FOR A NONVOLATILE SEMICONDUCTOR MEMORY

BACKGROUND OF THE INVENTION (1) Field of the Invention

The present invention relates to a multilevel programming method for a semiconductor storage, in particular, for floating gate type nonvolatile semiconductor storage of a virtual ground memory array.

(2) Description of the Related Art

In recent years, virtual ground type flash memory devices aiming for high packing density have drawn attention, such as for example, 'A New Cell Structure for Sub-quarter Micron High Density Flash Memory' (IEDM Technical Digest, pp.269–270, 1995), and an ACT (Asymmetrical Contactless Transistor) type flash memory disclosed in 'An investigation of a sensing method of an ACT type flash memory' (ICD97-21, p.37, 1997, a technical report of The Institute of Electronics, Information and Communication Engineers).

In such an ACT type flash memory, programming and erasing operations are implemented based on the FN (Fowler-Nordheim) tunnel effect, and it is expected to be used for data storage type.

Referring now to FIGS. 1 and 2, the ACT type flash memory will be described.

An ACT type flash memory uses the FN tunnel effect when programming and erasing as stated above, and has a virtual ground array configuration in which each bit line is shared between two memory cells. In this way, in an ACT type flash memory, the bit lines are shared and formed of a diffusion layer to thereby reduce the number of contacts and enable a remarkable reduction of the array area, which leads to high integration.

Next, an ACT type flash memory device, as sectionally shown in FIGS. 2A and 2B, has, in order from the top, a control gate WL, an inter-layer insulating layer, a floating gate FG and a bit line (diffusion layer) arranged in a layered manner. The common bit line formed under and between the adjacent floating gates FG has different donor densities between the drain and source sides.

In FIG. 1 where ACT type flash memory cells are arranged in an arrayed configuration, MBLx represents main bit lines, SBLx represents sub-bit lines formed of a diffusion layer, WLx represents word lines, SGx represents gate selection signal lines, CONTACT represents a contact point between a main bit line and a sub-bit line (belonging to different layers).

Next, programming and erasing operations for an ACT type flash memory using the FN tunnel effect will be described.

First, programming the ACT type flash memory (see FIG. 2A) is performed with a negative voltage of –8 volts ('volts' will be abbreviated hereinbelow as 'V') applied to gate WL and a positive voltage of 5 V applied to the drain side. By this voltage application, the FN tunnel effect occurs on the drain side so that electrons are extracted from floating gate FG to the drain side. This extraction of electrons lowers the threshold level, which means that programming is implemented.

An erase operation is performed with a high voltage (+10 V) applied to gate WL and a negative voltage (–8 V) applied to the bit lines and the substrate (P-portion) so as to generate the FN tunnel effect between the channel layer and floating gate FG to thereby inject electrons into the floating gate FG. This injection of electrons raises the threshold level, which means that erasing is implemented.

The operating principle of one ACT type flash memory (memory cell) M schematically shown in FIG. 3 will be described more detailedly.

In an ACT type flash memory M, a control gate 100, a inter-layer insulating layer 101, a floating gate 102 and a tunnel oxide film 103 are formed in layers and this layered structure is placed over and between a drain 105 and source 106 formed within a substrate 104. As already mentioned, drain 105 and source 106 have different donor densities from each other.

In the beginning, for a program operation, or to extract electrons from floating gate 102, a negative voltage Vnw (–8 V) is applied to control gate 100, a positive voltage Vpp (+5 V) is applied to drain 105 and source 106 is set floating. Under these conditions, electrons are drawn from floating gate 102 by the FN tunnel effect, and thereby the threshold level of memory cell M is lowered to about 1.5 V.

For an erase operation, or to inject electrons into floating gate 102, a positive voltage Vpe (+10 V) is applied to control gate 100, a negative voltage Vns (–8 V) is applied to source 106 and drain 105 is set floating. Under the conditions electrons are injected into floating gate 102 by the FN tunnel effect and thereby the threshold level of memory cell M is raised over about 4 V.

A flash memory as above which uses the FN tunnel effect for both program and erase operations is called an FN—FN operating flash memory.

For a read operation, 3 V is applied to control gate 100, 1 V is applied to drain 105, 0 V is applied to source 106. The current flowing through cell M under the conditions, is detected by an unillustrated sensing circuit to read out the data.

The application of voltage for the above operations is summarized in Table 1.

TABLE 1

Application of voltage to a conventional flash memory

|  | Control Gate | Drain | Source | P-type Well |
| --- | --- | --- | --- | --- |
| Program | –8 V | 5 V | Open | 0 V |
| Erase | 10 V | Open | –8 V | –8 V |
| Read | 3 V | 1 V | 0 V | 0 V |

In the field of memory technology, as an attempt to aim at higher integration, multilevel techniques for introducing three or more threshold levels to each memory cell have been published. Examples of the multilevel technology include the following methods.

A first conventional method (conventional method 1) is disclosed in 1997 ISSCC Dig. Tech. Papers, pp36–37 "A 98 mm² 3.3V 64 Mb Flash Memory with FN-NOR Type-4level cell" and in Japanese Patent Application Laid-Open Hei 6 No.177,397.

A second conventional method (conventional method 2) is disclosed in 1997 ISSCC Dig. Tech. Papers, pp32–33 "A 3.3V 128 Mb Multilevel NAND Flash Memory For Mass Storage Applications" and in Japanese Patent Application Laid-Open Hei 9 No.7,383.

In the conventional method 1, an FN-NOR type flash memory is used. The flowchart of the algorithm for programming memory cell M is shown in FIG. 4. In this case, for data '11', '10', '01', programming pulses are simultaneously applied by applying different voltages to drains 105, making use of the threshold level voltage-to-time characteristic shown in FIG. 5. Based on this characteristic, each cell is programmed so as to have a voltage level falling within one of the threshold levels in the distribution shown in FIG. 6 (Step S20).

As shown in FIG. 6, data '00' is the erased state. Subsequently, a verify operation (data verification after programming) (Step S21) is performed in two stages.

At the first stage, the reference voltage (the standard voltage with which comparison is made) is set at around 2.3 V, for example, so as to judge whether the threshold level falls within the '11' and '10' states or within the '01' and '00' states (see FIG. 6).

Next, at the second stage, a different operation will be effected based on the sensed result from the first stage. When the sensed result from the first stage falls within the '11' and '10' states, then the reference voltage is set at 1.3 V, for example, so as to determine whether the threshold level is '11' or '10'. When the sensed result from the first stage falls within the '01' and '00' states, then the reference voltage is set at 3.3 V, for example, so as to determine whether the threshold level is '01' or '00'.

The above operations, that is, application of the programming pulses and verification, are repeated based on the verification result until the desired threshold level is obtained (Steps 20 and 21 in FIG. 4). Generally, the characteristics of the change in threshold level fluctuates when the FN tunnel effect is used, so that a pulse width shorter than that meeting the actual characteristic is used. That is, pulse applications (voltage application to the bit lines) are stopped in the order in which programming is completed, so as to set the designated threshold levels whilst preventing the lowering of the threshold levels.

Conventional method 2 is used in an NAND type flash memory. FIG. 7 shows a flowchart of the algorithm for this method. FIG. 8 shows a distribution chart of the threshold levels after programming.

In the case of this NAND type flash memory, as shown in FIGS. 7 and 8, programming is commenced from the level closest to the erased state.

In the beginning, data '10' around 0.6 V is determined (Steps S30 and S31). Then, data '01' around 1.8 V (Steps S32 and S33) and data '00' around 3.0 V (Steps S34 and S35) are written in, in this order.

In this NAND type flash memory, a technique whereby the voltage of gate 100 is increased whenever a pulse is applied is used. Therefore, it is preferred that data, i.e., threshold level should be determined from the state closest to the erased state.

When the multilevel programming method used for the NAND type flash memory (FIGS. 7 and 8) is adopted as the method for introducing three or more threshold levels to an ACT type flash memory, or more specifically, or when the data is determined sequentially from the state closest to the erased state '11', the following problems occur.

FIG. 11 shows a flowchart of the algorithm when the multilevel programming method which is used for the NAND type flash memory is applied to an ACT type flash memory configured as shown in FIG. 9. FIG. 10 shows the distribution of the threshold levels after programming the ACT type flash memory. Here, data '00' is the erased state, and programming is performed with verification, from data '01', which is closest to the erased state (Steps S40 and 41).

During this, cells M having data other than '01' will not be written into. If all the memory cells M have data other than '01', no programming is effected in this initial stage so that all the memory cells remain in the erased state.

The range of the threshold level of cell M having data '01' is between 2.6 V and 3 V as shown in FIG. 10.

Subsequently, programming of data '10' and then data '11' is effected with verification (Steps S42 to S45).

For example, a case where memory cell M02 is read out for verification (including read operation) will be considered. This operation is performed with +3 V applied to word line (WL0), +1 V applied to bit line BL2 (on the drain side) and 0 V applied to bit line BL3 (on the source side). In this case, the following three situations will occur.

In the above case, bit line BL1 is set at +1 V so as not to allow for a roundabout current to flow through cell M01. Here, the bit lines are provided as units of four bits (BL0 to BL3, BL4 to BL7 and the like), but the detailed description is omitted.

First, as shown in FIG. 12, when cells M01 and M03 adjacent to cell M02 have data '00', of which the threshold level is higher than that of cell M02, current I01 flows correctly so that an unillustrated sensing circuit will detect the correct threshold level.

On the other hand, as shown in FIG. 13, when M00 and M01 have data '11', of which the threshold level is lower than that of cell M02, in reading out data of cell M02, a roundabout current Ir, other than the normal current I01 flowing through cell M02, will flow by way of cells M00 and M01. Because bit line BL1 is also applied with 1 V, normally no roundabout current Ir should occur. However, as already mentioned, an ACT type cell uses bit lines BL formed of a diffusion layer so that it presents high resistance, which may lower the potential to 0.5 V, for example, due to voltage drop. This is why a roundabout current Ir as above arises.

In this way, if an increased current (I01+Ir), which is greater than the normal current I01, is detected at the node on bit line BL2, apparently the threshold level of cell M02 is erroneously detected as a lower value by an unillustrated sensing circuit. When this situation is observed it is as if the distribution of the threshold level were shifted lower (in the direction of arrow 1 in FIG. 14) and widening its range, as shown in FIG. 14.

Further, also when cells M00 and M01 have data '00' (which has the greater threshold than that of cell 02) and cells M03 and M04 have data '11' (which has the lower threshold than that of cell 02) as shown in FIG. 15, erroneous detection can occur.

In this case, no current flows on the cell M01 side. However, because bit line BL5 is set at 1 V (the same voltage applied to BL1 in the block BL0 to BL3 is applied correspondingly to BL5 in the block BL4 to BL7), a roundabout current Ij will flow through M03 and M04 in which the threshold level is lower. As a result, the potential of bit line BL3 rises over 0 V, which is the normal voltage.

In this case, the current (Ibl=I01+Ij) for cell M02 at the node of bit line BL2 decreases due to the backgating effect. In this situation, the threshold level of cell M02 is apparently mis-detected to be shifted higher than the correct threshold level of cell M02 (in the state where only current I01 flows). This situation will be detected as if the distribution of the threshold level (the hatched area) were widened in the direction of arrow 2 as shown in FIG. 14.

In this way, when the data is determined from the state closest to the erased state in order to write multi-levels of data to an ACT type flash memory, the distribution of the threshold level should normally fall within the range of 0.4 V wide from 2.6 V to 3.0 V, but the range (fluctuation) of the threshold level will be detected spreading as wide as 1.0 V from 2.2 V to 3.2 V (see FIG. 14).

In this case, taking into account that the readout voltage for distinguishing between the threshold levels of '10' and '01' is set at about 2.3 V (corresponding to the readout voltage 2 in FIG. 10), this widening of the distribution of the threshold level will cause the erroneous reading, which degrades reliability.

In FIG. 14, the case of data '01' was explained, a similar widening of the distribution of the threshold level occurs in the case of data '10'.

Next, description will be made of the case where the multilevel programming method used in the aforementioned FN-NOR type flash memory is applied to an ACT cell type.

FIG. 16 shows a flowchart of the algorithm of this case. In this method, programming is performed simultaneously for all the levels (Steps S50 and 51). However, the programming characteristics generally differ between cells M, so that the time required for one cell to gain the designated level will be different from others. The worst case is that where the cell having data '01' reaches its threshold level first. In this case, the distribution (range) of each threshold level widens in a similar manner to the above case, again causing erroneous reading.

SUMMARY OF THE INVENTION

The present invention has been devised in order to solve the above problems and it is therefore an object of the invention to provide a programming method for a nonvolatile semiconductor memory for enabling programming and verification in which widening of the threshold levels occurring in a virtual ground type array such as an ACT type is limited.

In order to achieve the above object, the present invention is configured as follows:

In accordance with the first aspect of the invention, a programming method for a nonvolatile semiconductor memory comprising: a number of electrically data-programmable, erasable floating gate field effect transistors that are memory cells, each having a control gate, drain and source with a floating gate, arranged matrix-wise in rows and columns; a plurality of row lines, each connecting the control gates of memory cells located in one row; and a plurality of column lines, each connecting the drain and source of memory cells constituting columns, forming a virtual ground type array wherein each memory cell is adapted to have three or more number of storage states so as to store multilevel data by differentiating the amount of charge on the floating gate, is characterized in that the memory cells are programmed starting sequentially in the order of degree of the difference in charge amount in the floating gate from the erased state.

In accordance with the second aspect of the invention, a programming method for a nonvolatile semiconductor memory comprising: a number of electrically data-programmable, erasable floating gate field effect transistors that are memory cells, each having a control gate, drain and source with a floating gate, arranged matrix-wise in rows and columns; a plurality of row lines, each connecting the control gates of memory cells located in one row; and a plurality of column lines, each connecting the drain and source of memory cells constituting columns, forming a virtual ground type array wherein each memory cell is adapted to have four or more number of storage states so as to store multilevel data by differentiating the amount of charge on the floating gate, is characterized in that the memory cells are programmed in such a manner that programmed states which produce the greater difference in charge amount in the floating gate from the erased state are written in first and then the other programmed states are written in.

In accordance with the third aspect of the invention, the programming method for a nonvolatile semiconductor memory having the above second feature is characterized in that the memory cells are programmed in such a manner that the programmed state which produces the greatest difference in charge amount in the floating gate from the erased state is written in first and then the other programmed states are written in.

In accordance with the fourth aspect of the invention, the programming method for a nonvolatile semiconductor memory having to any one of the above first through third features is characterized in that the threshold level of readout voltage for the erased state in the nonvolatile semiconductor memory is higher than the threshold level of readout voltage for the programmed state.

In accordance with the fifth aspect of the invention, the programming method for a nonvolatile semiconductor memory having to any one of the above first through third features is characterized in that the threshold level of readout voltage for the erased state in the nonvolatile semiconductor memory is equal to or greater than 3.0 V while the lowest threshold level of readout voltage for the programmed state falls within the range between 0.5 V and 1.5 V.

In accordance with the sixth aspect of the invention, the programming method for a nonvolatile semiconductor memory having to any one of the above first through third features is characterized in that the threshold level of readout voltage for the erased state in the nonvolatile semiconductor memory is higher than the threshold level of readout voltage for the programmed state and the threshold level of readout voltage for the erased state in nonvolatile semiconductor memory is equal to or greater than 3.0 V while the lowest threshold level of readout voltage for the programmed state falls within the range between 0.5 V and 1.5 V.

According to the above configurations, in a nonvolatile semiconductor memory in which each memory cell is enabled to have a multiple number of storage states by differentiating the amount of charge on the floating gate, the memory cells are programmed starting sequentially in the order of degree of the difference in charge amount in the floating gate from the erased state, or the memory cells are programmed by writing first, the programmed state which produces the greatest difference and second, the other programmed states, at almost the same time.

By this configuration, it is possible to reduce the widening of the distribution of the threshold levels due to programming (programming with verification), which results from virtual ground type array configurations such as an ACT type flash memory. Therefore, the configurations of the present invention can provide a wide reading margin, thus making it possible to realize a highly reliable multilevel flash memory.

Further, it is also possible to provide a wide reading margin while reducing the time for multilevel programming.

DESCRIPTION OF THE PREFERRED EMBODIMENTS

Figure 1:
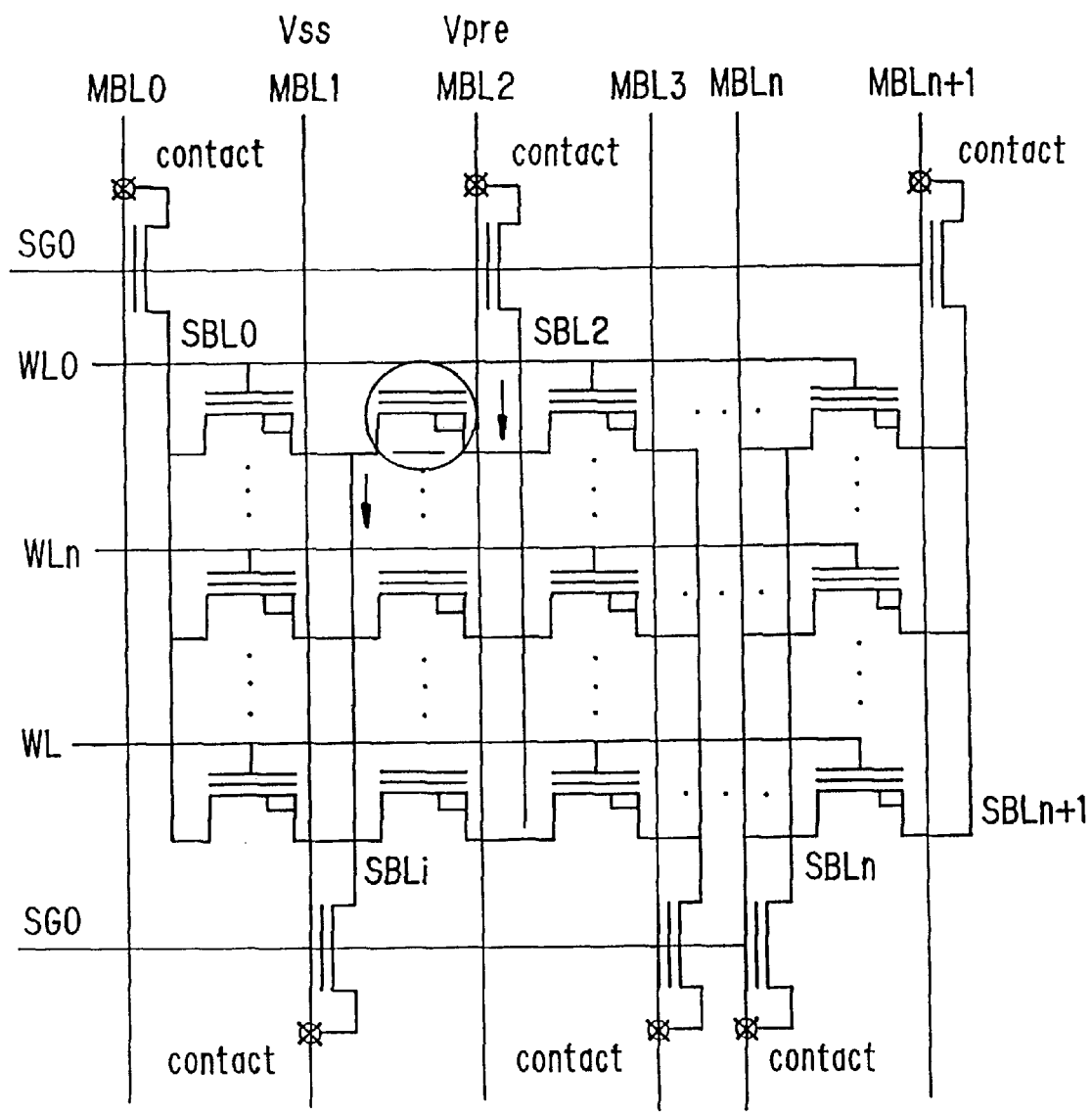
FIG. 1 is a diagram for illustrating the circuit of a nonvolatile semiconductor memory constituting a virtual ground type array.
Figure 2A:
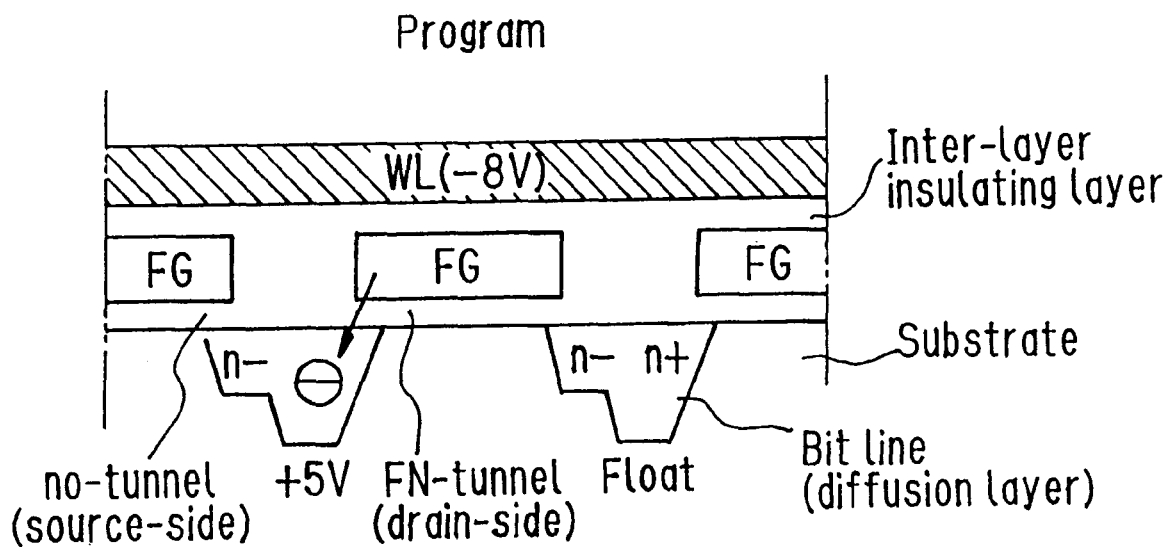
FIGS. 2A and 2B are sectional views for illustrating the operations of a nonvolatile semiconductor memory constituting a virtual ground type array, during programming (FIG. 2A) and during erasing (FIG. 2B)
Figure 2B:
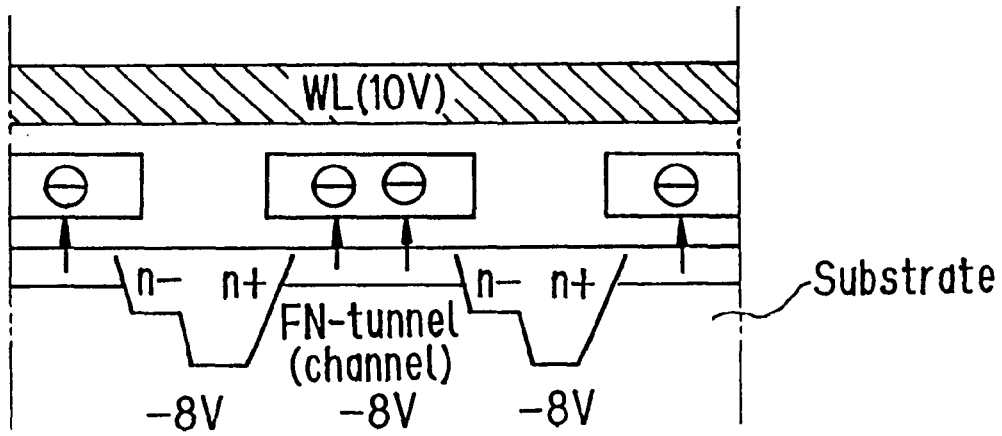

The first embodiment of the invention will hereinafter be described in detail with reference to the accompanying drawings. The same components as in the configuration described above are allotted with the same reference numerals so as to omit the repeated description.

Figure 3:
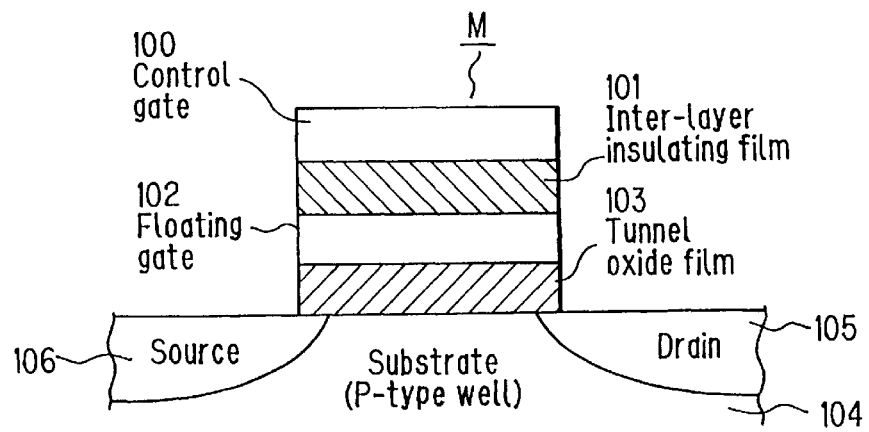
FIG. 3 is an illustrative sectional view showing the configuration of a nonvolatile semiconductor memory cell constituting a virtual ground type array.
Figure 4:
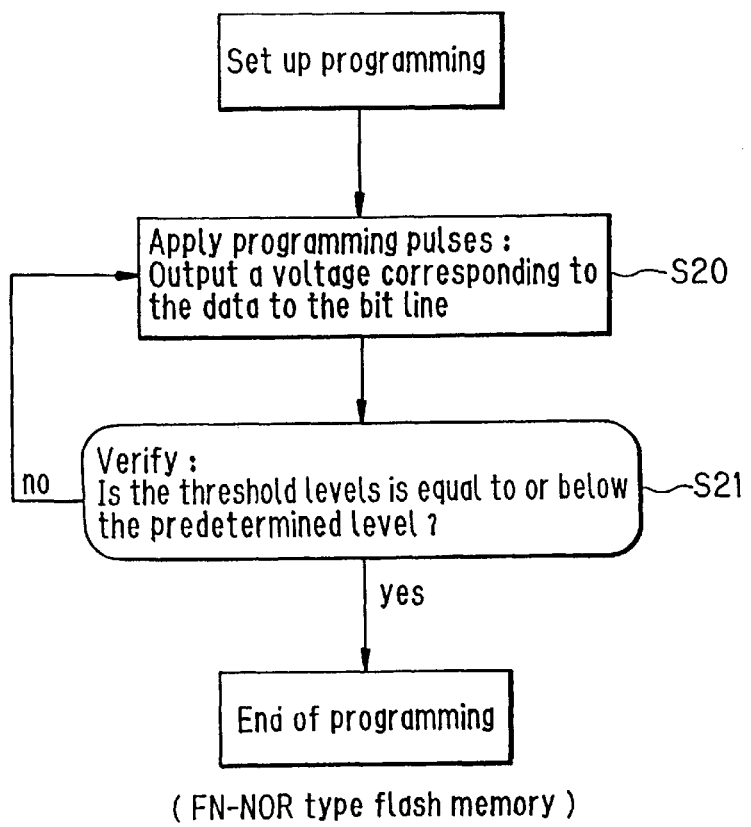
FIG. 4 is a flowchart of a conventional multilevel programming method for an FN-NOR type flash memory.
Figure 9:
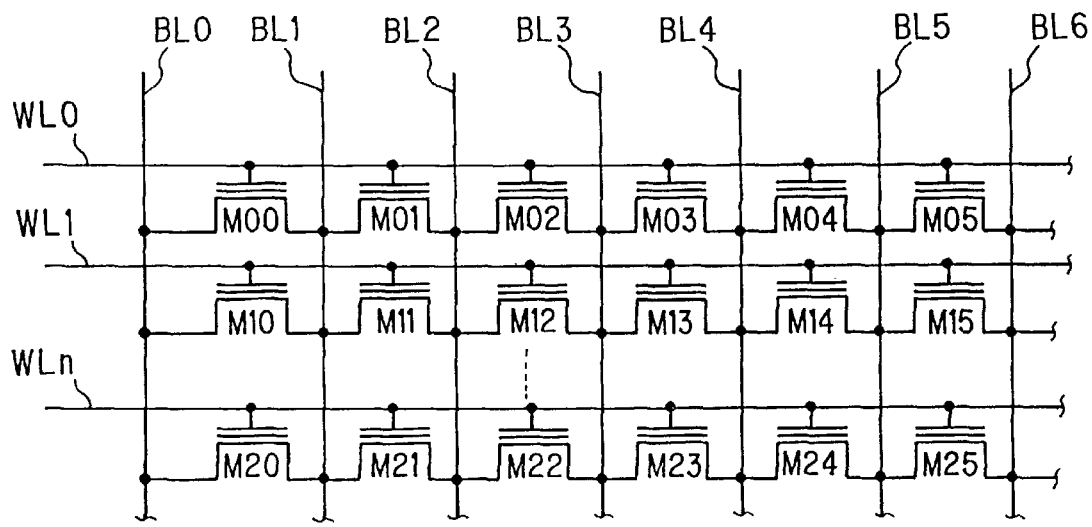
FIG. 9 is an illustrative diagram showing a nonvolatile semiconductor memory constituting a virtual ground type array.

FIG. 9 shows part of an ACT type nonvolatile semiconductor memory according to the embodiment of the invention. In this figure, memory cells M, each being a floating gate field effect transistor shown in FIG. 3 with which data can be electrically written and erased, are arranged in rows and columns, forming a memory array. The nonvolatile semiconductor memory constituting a virtual ground type array includes: a plurality of row lines (WL0 to WLn) which each are connected to control gates 100 of memory cells M on the same row; and seven column lines (BL0 to BL6) which are commonly connected to drain terminals 105 and source terminals 106 of memory cells M constituting columns.

Programming the above nonvolatile semiconductor memory is performed by differentiating the amount of charge on each floating gate 102 so that each memory cell M can have a multiple number of storage states. This embodiment will be described with a configuration in which four levels of storage states '11', '10', '01' and '00' can be stored.

Figure 10:
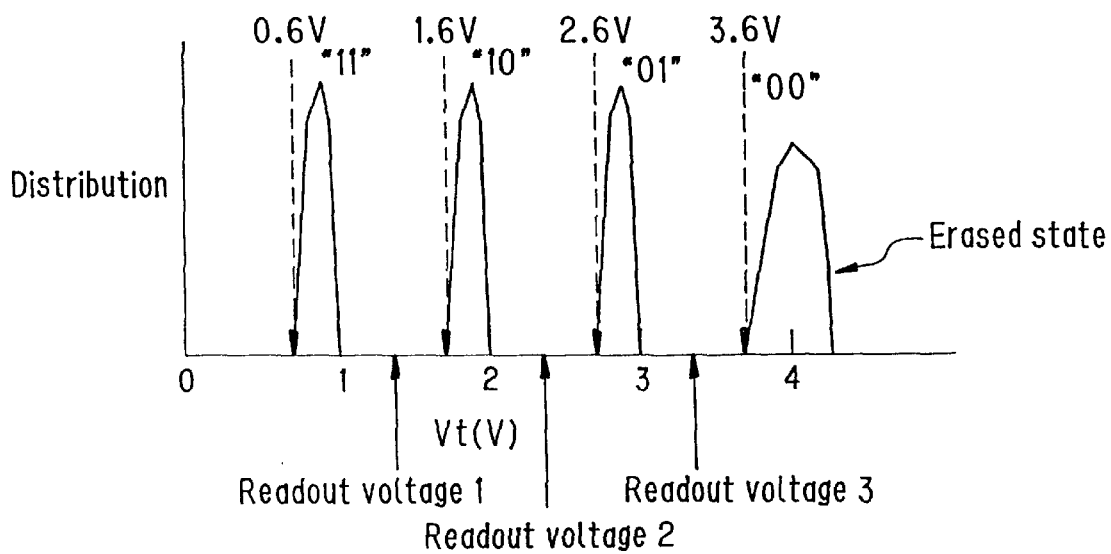
FIG. 10 is an illustrative chart showing a distribution of multilevel threshold levels in a nonvolatile semiconductor memory constituting a virtual ground type array.

FIG. 10 shows the range of the threshold levels of readout voltage when the above four states are stored. The range of the threshold level of each data is: 0.6 V to 1.0 V for '11'; 1.6 V to 2.0 V for '10'; 2.6 V to 3.0 V for '01'; and 3.6 V to 4.0 V for '00'.

Figure 17:
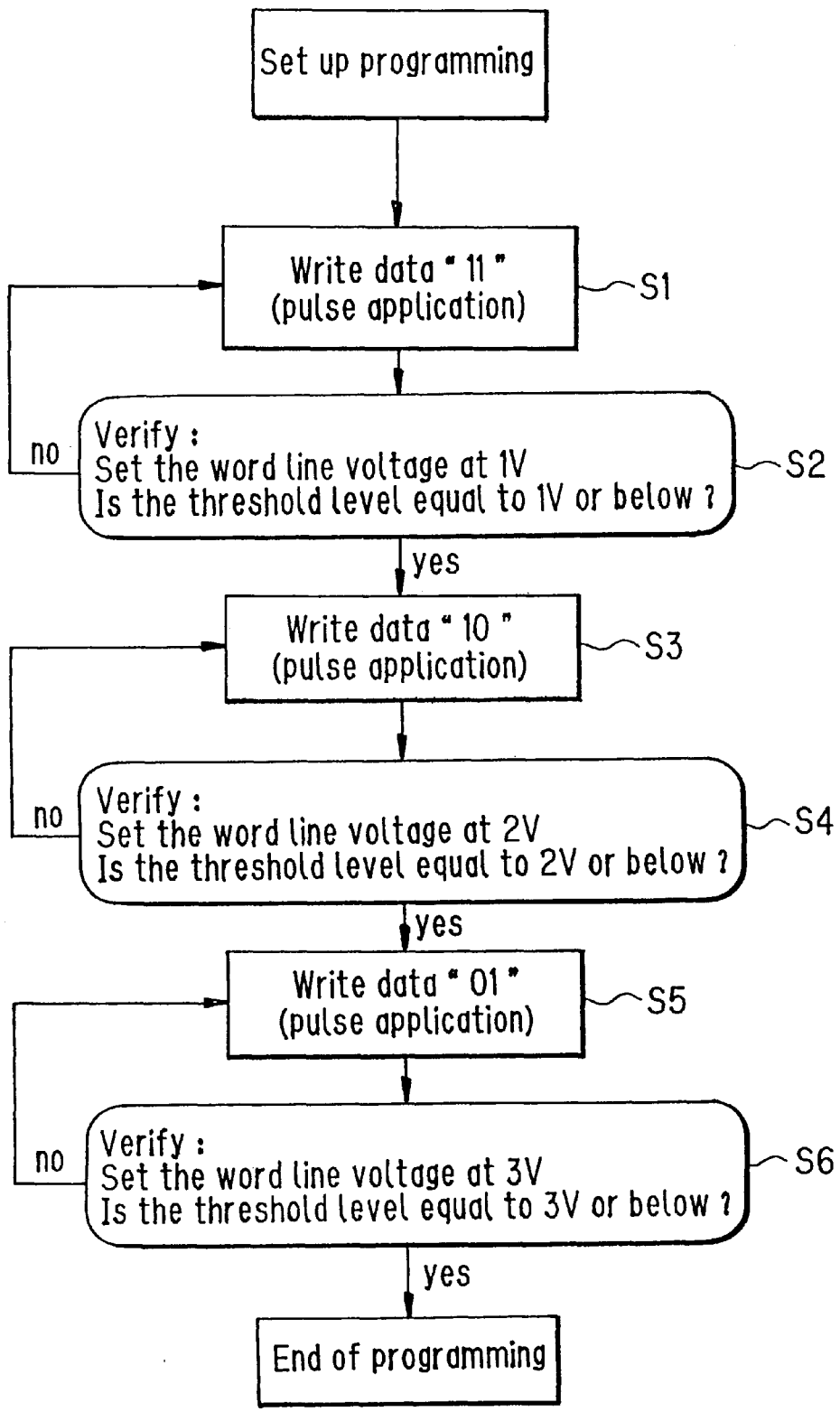
FIG. 17 is a flowchart for a method of programming a nonvolatile semiconductor memory constituting a virtual ground type array in accordance with the first embodiment of the invention.

In the method of programming the above nonvolatile semiconductor memory, memory cells M is programmed starting in the order of degree of the difference in charge amount in floating gate 102 from the erased state (data '00') (see FIGS. 10 and 17).

Referring next to the flowchart of FIG. 17, explanation will be made of a method of programming the ACT type flash memory in the array configuration of FIG. 9, where data '11', '10' and '01' are written into cells M00, M01 and M02, respectively.

First, data '11' which has the greatest difference from the threshold level of the erased state (also corresponding to data '00') is written in. That is, programming is started from cell M00 so that −8 V is applied to word line WL0 with 5 V applied to bit line BL0 (Step S1). In this case, bit lines BL1, BL2 and BL3 are set floating.

When programming of cell M00 is finished, the threshold level of memory cell M00 lowers, while programming of cells M01 and M02 has not yet been effected so that they are kept in the erased state or at the high threshold level.

Next, verification is performed with 1 V applied to word line WL0 (Step S2). This loop, i.e., application of programming pulses and verification will be continued until cell M00 and other cells to which data '11' needs to be written in have a threshold level equal to or lower than 1 V.

Figure 5:
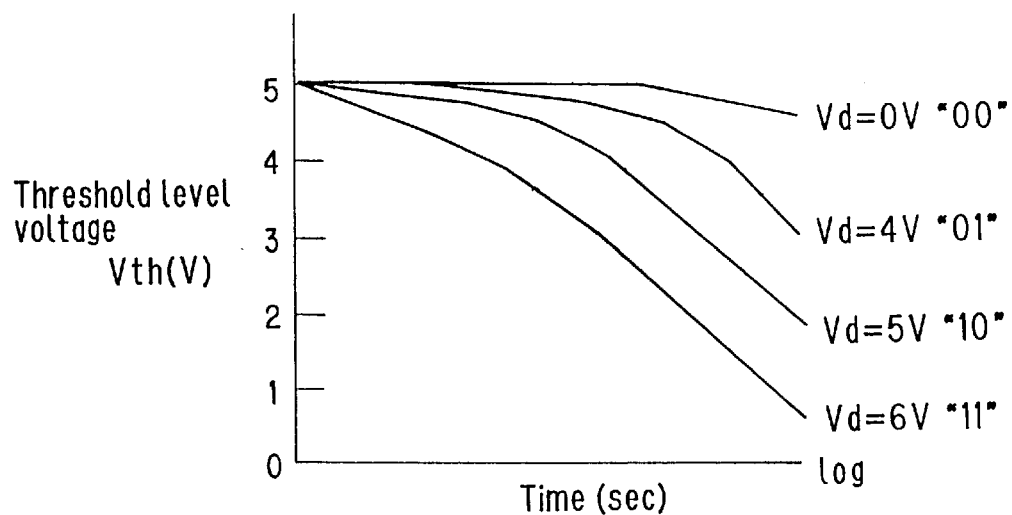
FIG. 5 is an illustrative chart showing the characteristics of programming a flash memory cell.
Figure 6:
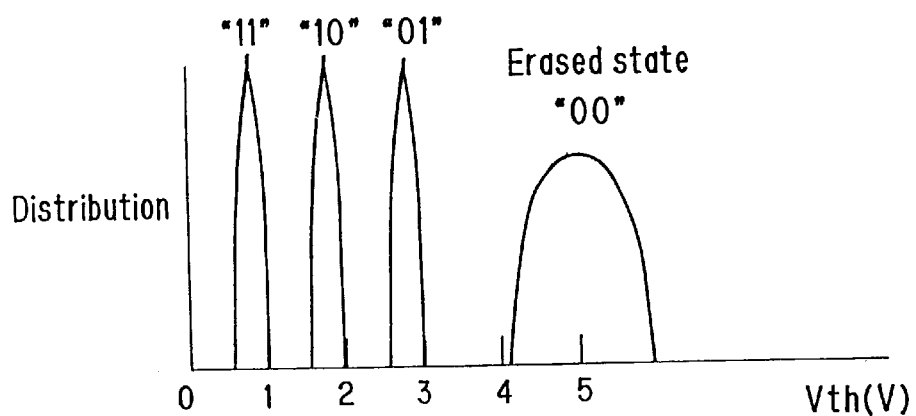
FIG. 6 is an illustrative chart showing a distribution of multilevel threshold levels in accordance with a conventional programming method for an FN-NOR type flash memory.
Figure 7:
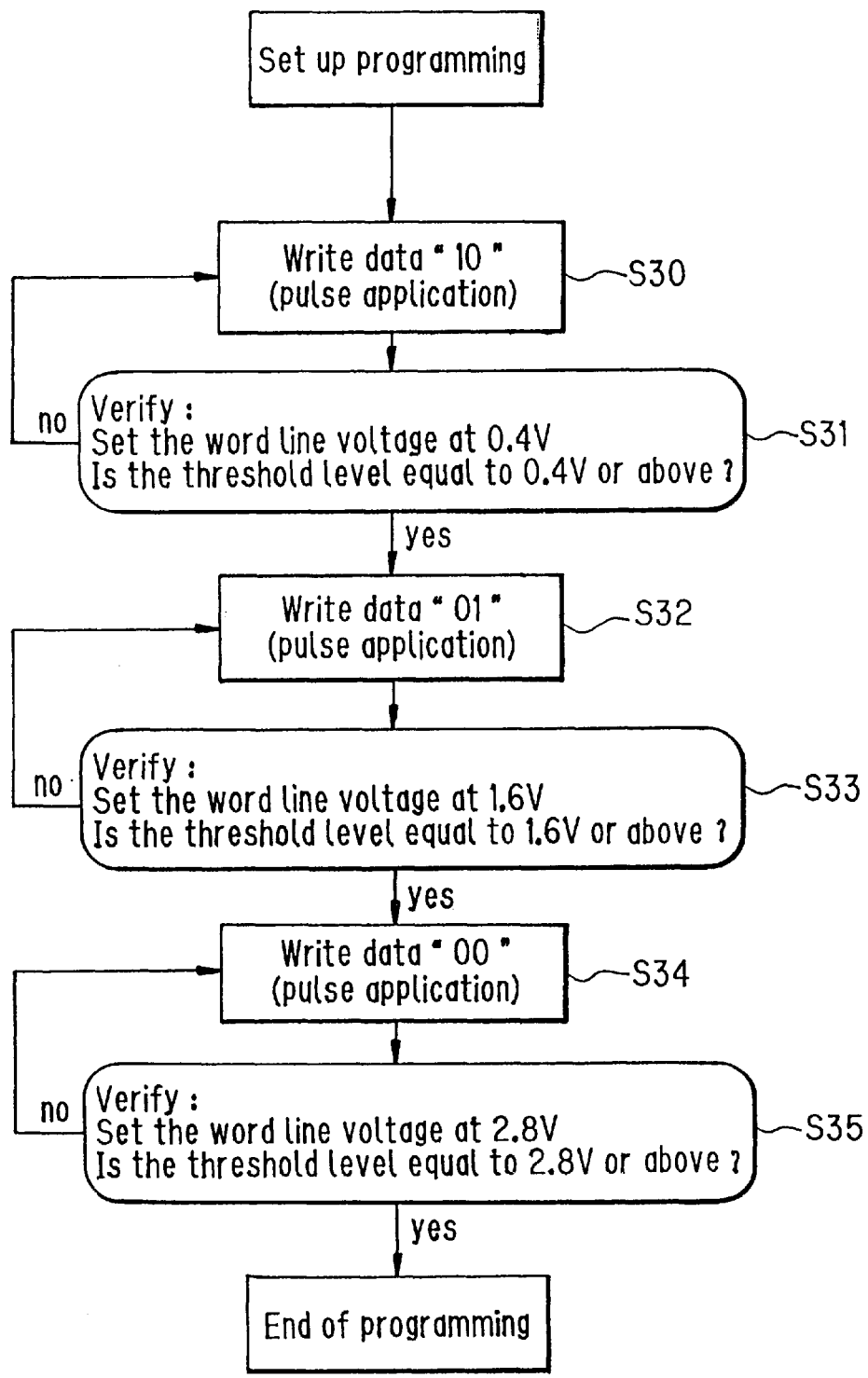
FIG. 7 is a flowchart of a conventional multilevel programming method for a NAND type flash memory.
Figure 8:
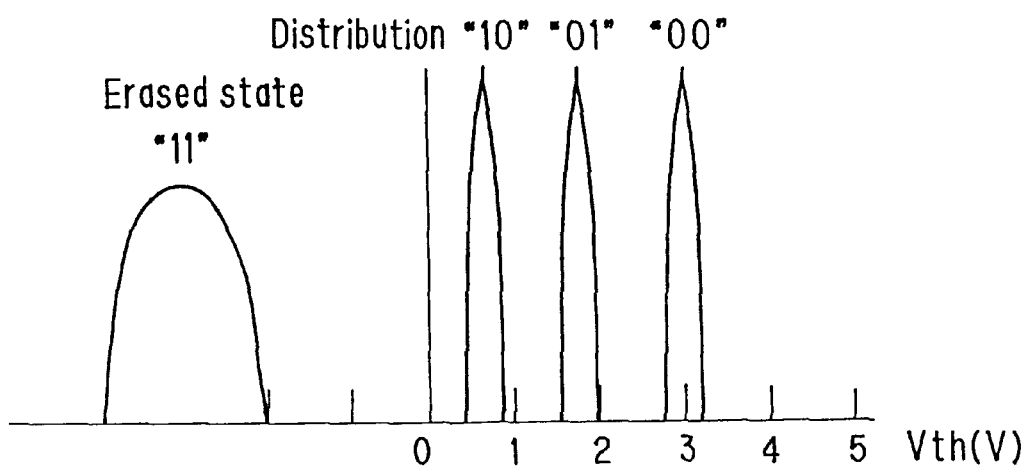
FIG. 8 is an illustrative chart showing a distribution of multilevel threshold levels in accordance with a conventional method of programming for a NAND type flash memory.

As to the programming pulses here, pulses of 5 V as the drain voltage (see FIG. 5) are applied repeatedly so as to lower the threshold level from the erased state to the designated level.

When the threshold levels of the cells, including cell M00, to which data '11' needs to be written in have become equal to or lower than 1 V, −8 V is applied to word line WL0 and 5 V is applied to bit line BL1 in order to write data '10' to cell M01 (Step S3). In this case, bit lines BL0, BL2 and BL3 are set floating.

When programming of cell M01 has been completed by application of voltage to cell M01, the threshold level lowers, while the threshold levels of cells M00 and M02 remain unvaried so that cell M02 is kept in the high state (the erased state) and memory cell M00 is kept at the threshold for '11', which is equal to or lower than 1 V.

Then, with 2 V applied to word line WL0, application of programming pulses and verification will be continued until cell M01 and other cells to which data '10' needs to be written in have a threshold level equal to or lower than 2 V (Step S4).

When the threshold levels of the cells, Including cell M01, to which data '10' needs to be written in have become equal to or lower than 2 V, −8 V is applied to word line WL0 and 5 V is applied to bit line BL2 in order to write data '01' to cell M02 (Step S5). In this case, bit lines BL0, BL1 and BL3 are set floating.

When programming of cell M02 has been completed by application of the voltage, the threshold level of cell M02 lowers from the erased state (the highest threshold state), while memory cell M00 is kept equal to or lower than 1 V and cell M01 is kept equal to or lower than 2 V.

Then, with 3 V applied to word line WL0, application of programming pulses and verification will be continued until cell M02 and other cells to which data '01' needs to be written in have threshold levels equal to or lower than 3 V (Step S6).

Here, though no description has been made, programming is performed for other word lines WL1 to WLn following a similar algorithm at the appropriate timing. Here, bit lines BL are assumed to be configured in units of four bits (BL0 to BL3, BL4 to BL7, . . . BLm-3 to BLm), so that explanation has been made mainly for the block of BL0 to BL3.

Figure 18:
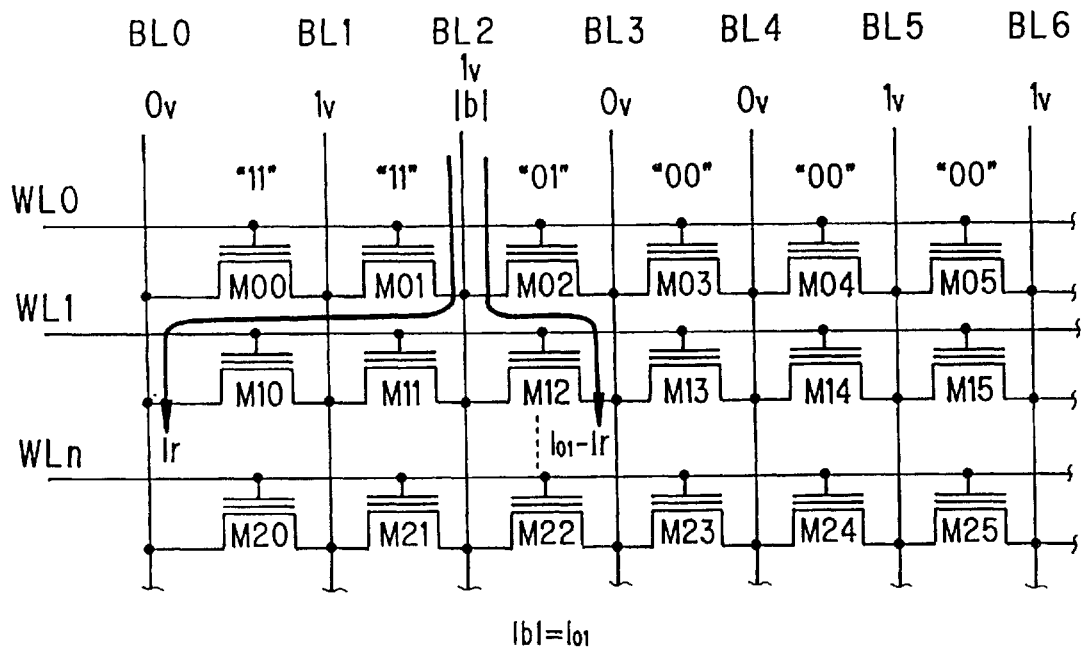
FIG. 18 is an illustrative diagram showing current paths when data written in a memory cell M02 in accordance with the programming method of the first embodiment of the invention is read out.
Figure 19:
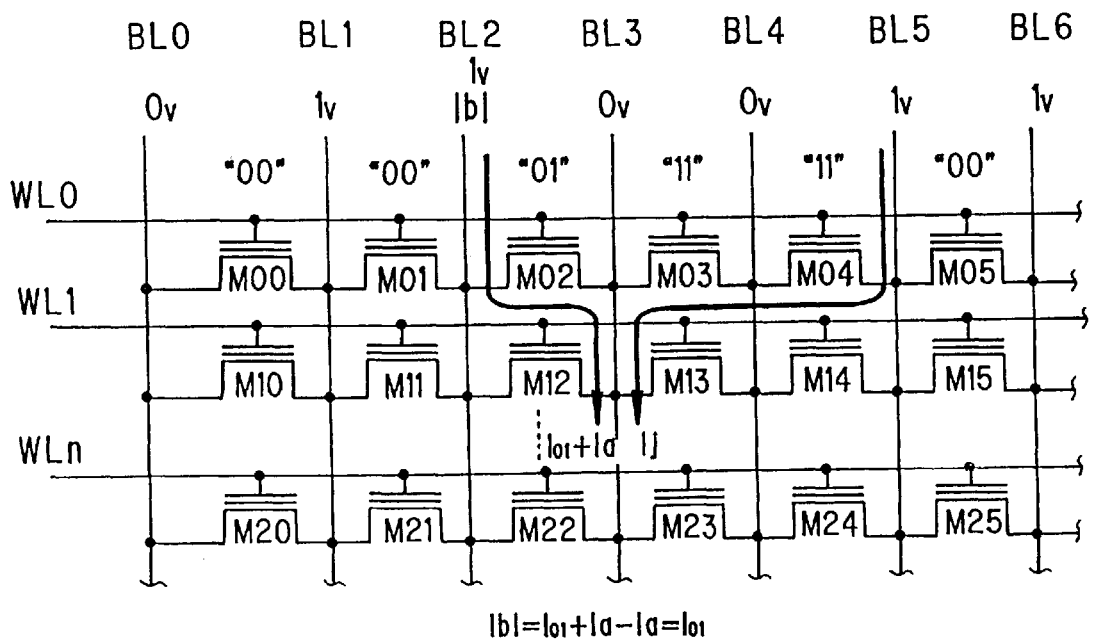
FIG. 19 is an illustrative diagram showing current paths when data written in a memory cell M02 in accordance with the programming method of the first embodiment of the invention is read out.

The advantages obtained from the use of the multilevel programming method for an ACT type flash memory in accordance with the first embodiment will be verified with reference to FIGS. 18 and 19 by assuming cases where misjudgment would occur in the conventional configuration.

As shown in FIG. 18, consideration will be made using the presumption that cells M00 and M01 have data of '11', i.e., the lowest threshold level and cells M03 and M04 have data of '00', i.e., the highest threshold level.

Now, a situation will be considered where the above algorithm is applied to the case in which cell M02 has data of '01' (which is the worst case in the conventional method where the threshold level of M02 is shifted lower). In this case, cells M00 and M01 to be set with data '11' or the lowest threshold level, are determined to be equal to or lower than 1 V by programming and verification.

Next, data '10' is determined in the same manner as above (not shown in FIG. 18), data '01' is then written in to cell M02, in this case.

At this time, since cells M00 and M01 adjacent to cell M02 have the lowest threshold level, a roundabout current Ir will flow during verification as shown in FIG. 18, under the conditions where, with cell M02 is being programmed whilst being verified (with the word line set at 3 V and 1 V applied to bit line BL2).

As already mentioned, because an ACT type cell uses bit lines BL formed of a diffusion layer, it presents high resistance, which will lower the potential to about 0.5 V due to voltage drop even when 1 V is applied to the adjacent bit line BL1 as shown in FIG. 18, thus causing the roundabout current Ir.

Figure 12:
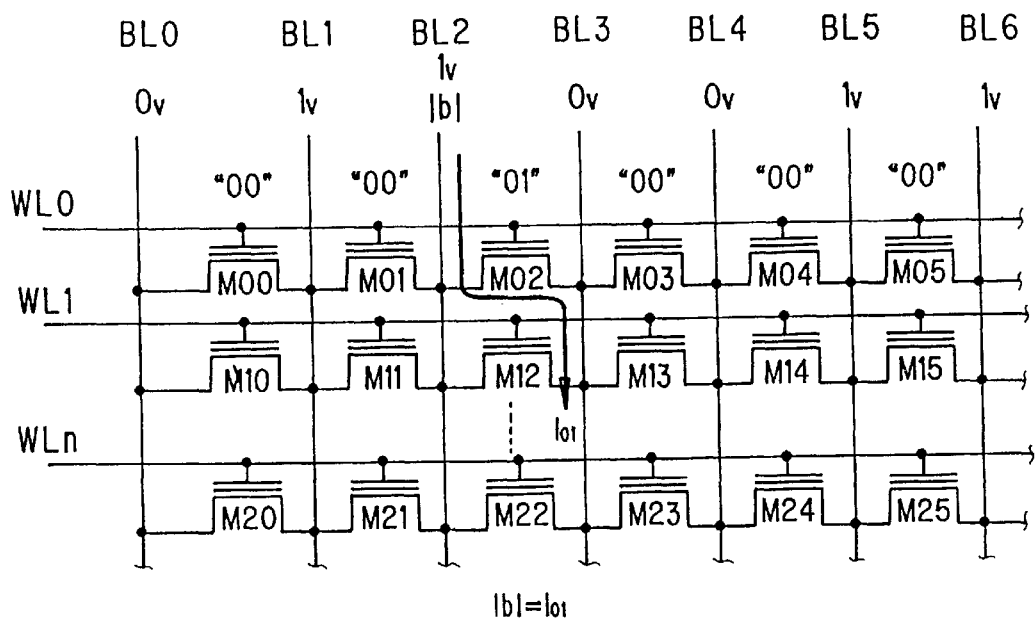
FIG. 12 is an illustrative diagram showing a current path when a memory cell M02 of an ACT type flash memory is programmed in accordance with the flow of FIG. 11.
Figure 13:
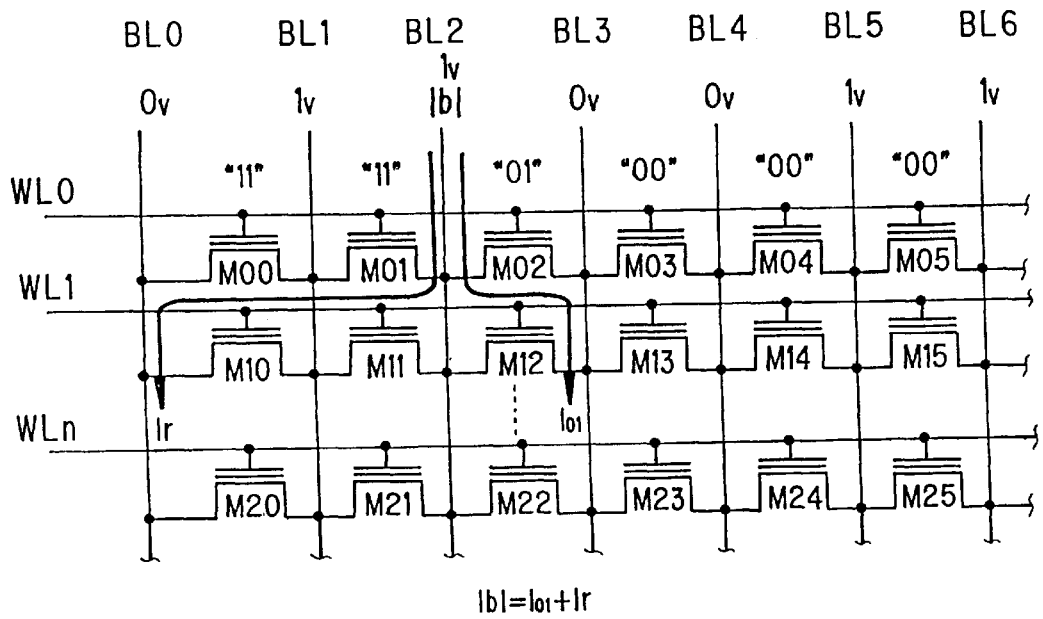
FIG. 13 is an illustrative diagram showing current paths when data is read from a memory cell M02 of an ACT type flash memory in accordance with the flow of FIG. 11.

Accordingly, the threshold level of cell 02 may and should be determined taking into account this roundabout current Ir. In other words, programming may and should be performed whilst verifying so that the total current, including roundabout current Ir, may be equal to I01. In the conventional technique (refer to FIGS. 5 and 12), for example, data '01' has been determined first, then data '11' which has the lower threshold level is determined. Therefore it was impossible to consider the roundabout current Ir. This is because at the point of determining data '01', no roundabout current will arise when the verification for determining the threshold is performed since all the adjacent cells have the higher threshold levels.

Using the above technique, widening of the threshold level to lower side will only occur when the adjacent cells have data '11'. However, the influence upon its neighbors from a cell having data '11', can be suppressed to the degree by which the threshold level of data '01' is shifted lower by only about 0.1 V.

Referring next to FIG. 19, a worst case where threshold levels are shifted higher will be verified.

Consideration will be made using the presumption that cells M00 and M01 have data of '00', i.e., the highest threshold level and cells M03 and M04 have data of '11', i.e., the lowest threshold level.

When cell M02 has data of '01', cells M03 and M04 to be set with data '11' are determined to be equal to or lower than 1 V.

Next, data '10' is determined (not shown in FIG. 19), data '01' is then written in to cell M02.

At that time, since cells M03 and M04 adjacent to cell M02 have a low threshold level, a roundabout current Ij will flow via cells M03 and M04 from bit line BL5. This is because the bit lines are configured in units of four bits as stated above, bit line BL5 is applied with 1 V in corresponding to bit line BL1.

Under these conditions, data '01' is written in to cell M02 whilst verifying.

Accordingly, the threshold level of cell M02 can be determined as shown in FIG. 19 by determining the total current I01 taking into account the potential rise at the node of bit line BL3 due to the roundabout current Ij.

In this technique of determining the total current I01, widening of the threshold level to the higher side will only occur when the adjacent cells have data '11'. However the influence upon its neighbors from a cell having data '11', can be suppressed to the degree by which the threshold level of data '01' is shifted higher by only about 0.05 V.

Figure 11:
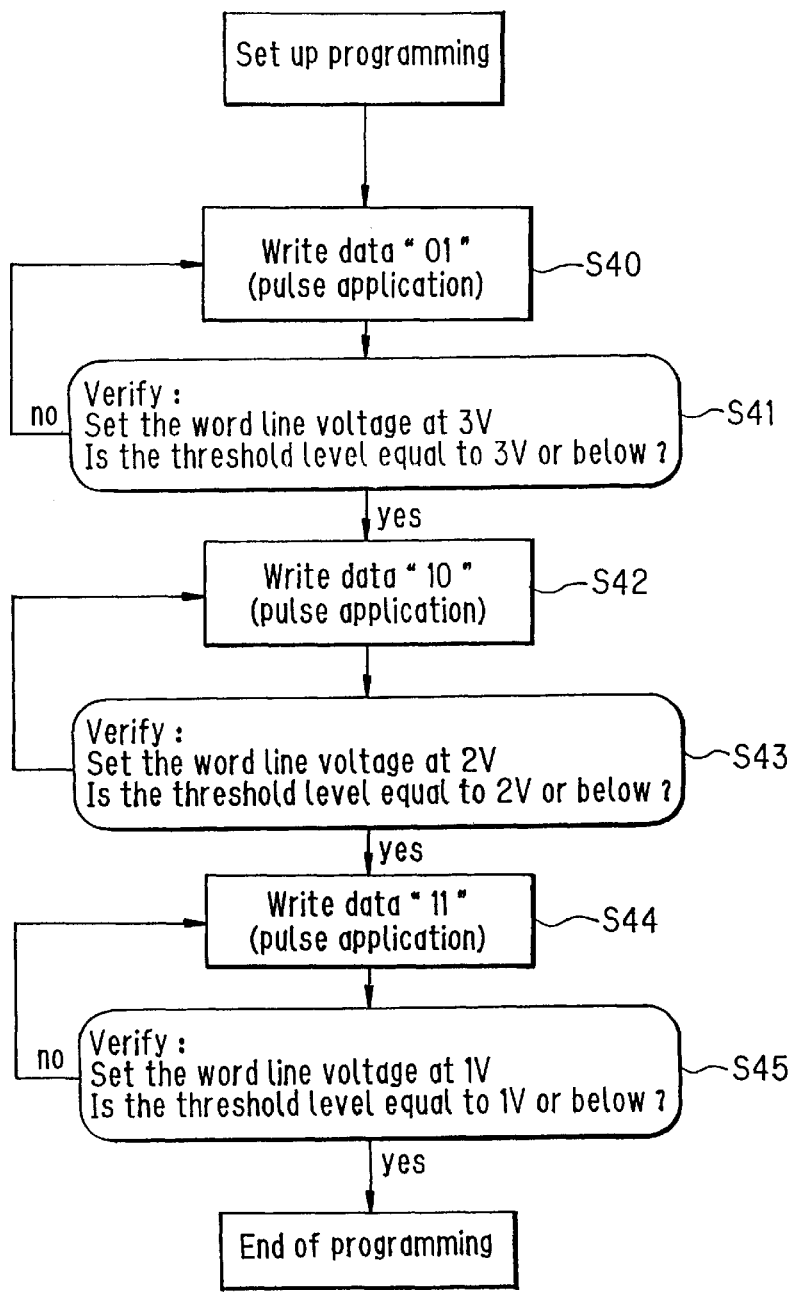
FIG. 11 is a flowchart for illustrating a conventional multilevel programming method for an ACT type flash memory (a multilevel programming method for an NAND type flash memory)
Figure 14:
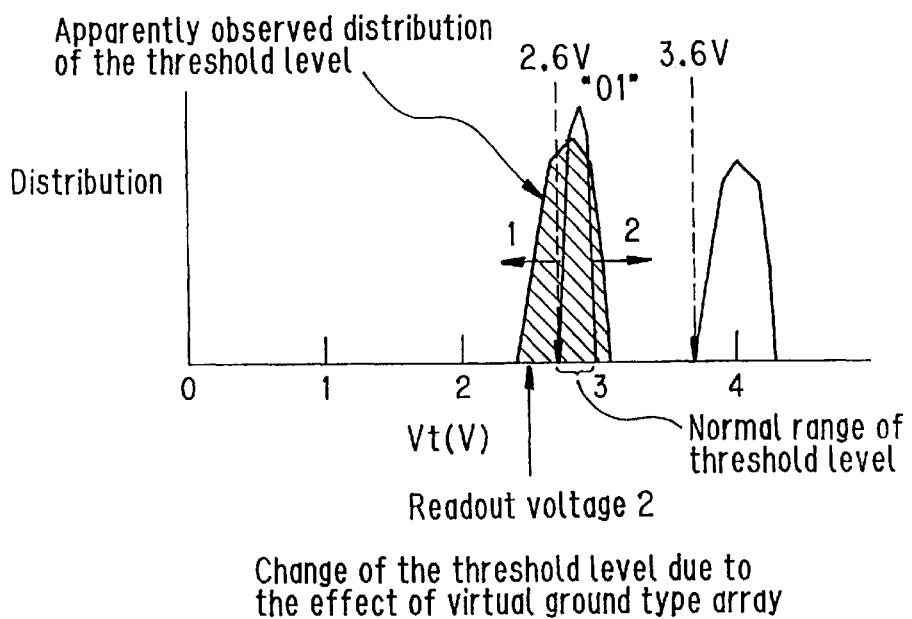
FIG. 14 is an illustrative chart showing the change of the threshold level of a memory cell 02 of an ACT type flash memory when it is programmed in accordance with the flow of FIG. 11.
Figure 15:
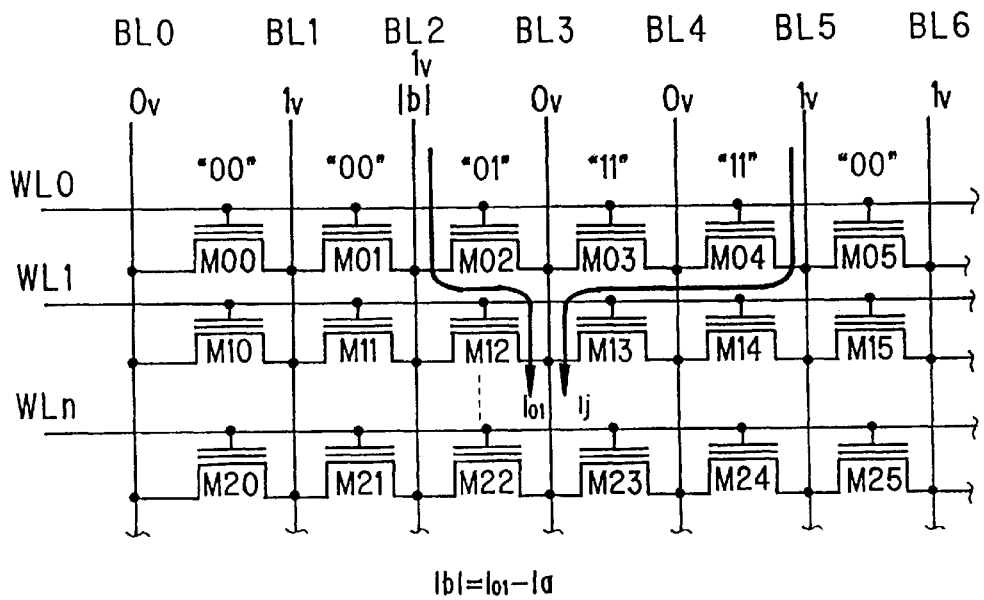
FIG. 15 is an illustrative diagram showing current paths when data is read from a memory cell M02 with low threshold levels in memory cells M00 and M01 of an ACT type flash memory, in accordance with the flow of FIG. 11.

When writing of multilevel data to the cells is effected following the above-explained algorithm, the spread of the threshold level for data '01' can be limited to within the range of 0.55 V wide from 2.5 V to 3.05 V, which is an improvement compared to the conventional configuration where the spread of the threshold level was within the range width of 1 V (from 2.2 V to 3.2 V) (the threshold level based on the algorithm shown in FIG. 11 varied as shown in FIG. 14).

This reduction of the widening of the distribution of the threshold level provides enlargement of reading margin hence making it possible to realize a highly reliable flash memory.

In accordance with the first embodiment as has been described, a method was described which determines the data from data '11' which is the furthest from the erased state, data '10', and data '01' in that order. This programming method needs processing time proportional to the number of the steps of multilevel programming. Now, a method of programming with a reduced processing time will be described as the second embodiment.

Figure 20:
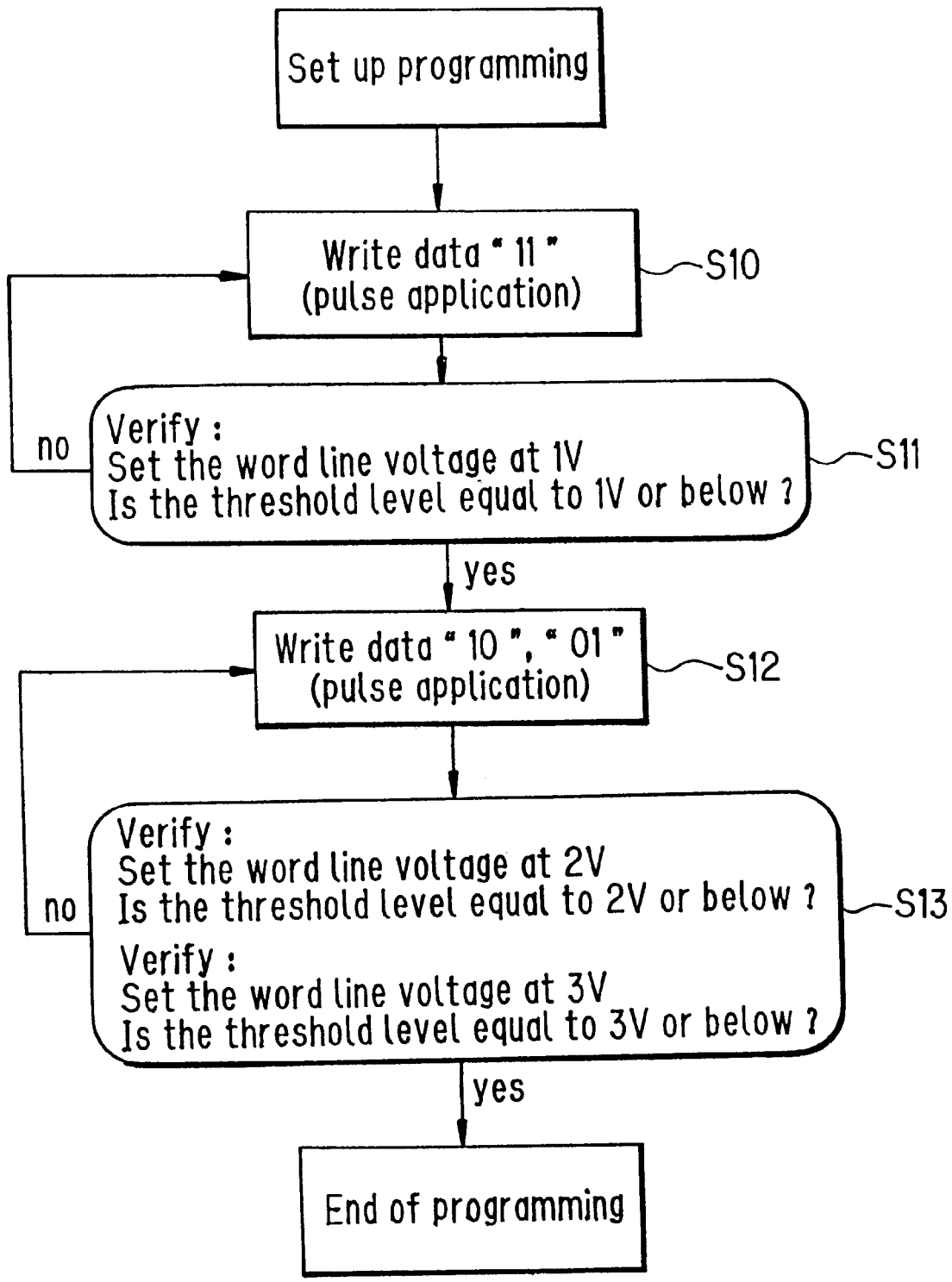
FIG. 20 is a flowchart for a method of programming a nonvolatile semiconductor memory constituting a virtual ground type array in accordance with the second embodiment of the invention.

Referring to FIG. 20 of the multilevel programming algorithm for an ACT type flash memory in accordance with the second embodiment of the invention, description will be made of a case where cell M00 is programmed with data '11', cell M01 with data '10' and cell M02 with data '01'.

First, in order to write data '11', −8 V and 5 V are applied to word line WL0 and bit line BL0, respectively (Step S10). Bit lines BL1, BL2 and BL3 are set floating.

Programming of cell M00 lowers the threshold level of cell M00 while programming of cells M01 and M02 has not yet been effected so that they are kept in the erased state or at the highest threshold level.

Then, verification is performed with 1 V applied to word line WL0 (Step S11). This loop, i.e., application of programming pulses and verification will be continued until cell M00 and other cells to which data '11' needs to be written into have threshold levels equal to or lower than 1 V. Up to this point, operation is the same as in the first embodiment.

Next, when cell M01 is programmed with data '10' and cell M02 Is programmed with data '01' with an application of −8 V to word line WL0, 5 V, for example, is applied to bit line BL1 for programming cell M01 with data '10' and 4 V, for example, is applied to bit line BL2 for programming cell M02 with data '01' to thereby perform simultaneous programming of the cells (Step S12).

For verification, data '10' is verified first with an application of 2 V to word line WL0 and then data '01' is verified with 3 V applied to word line WL0 (Step S13). In the manner as stated in the first embodiment, application of programming pulses and verification are repeated so as to determine data '01' and '10', at almost the same time.

The characteristic of the multilevel programming method for an ACT type flash memory presented in this embodiment resides in that the data which has the largest difference in charge amount in floating gate 102 from the erased state is written into and determined first.

Using this method, widening of the threshold level to the lower side will only occur when the adjacent cells M have data '01' and '10'. (Current paths, etc. are the same as the case of FIG. 18 except in that the data in cell M01 is replaced with '10'.)

Since widening of the threshold level is attributed to roundabout current Ir, the influence upon its neighbors from a cell having data '10' is greater than that from a cell having data '01'. This is because the threshold level of data '10' is lower than that of data '01' so that the roundabout current Ir naturally becomes greater.

Figure 16:
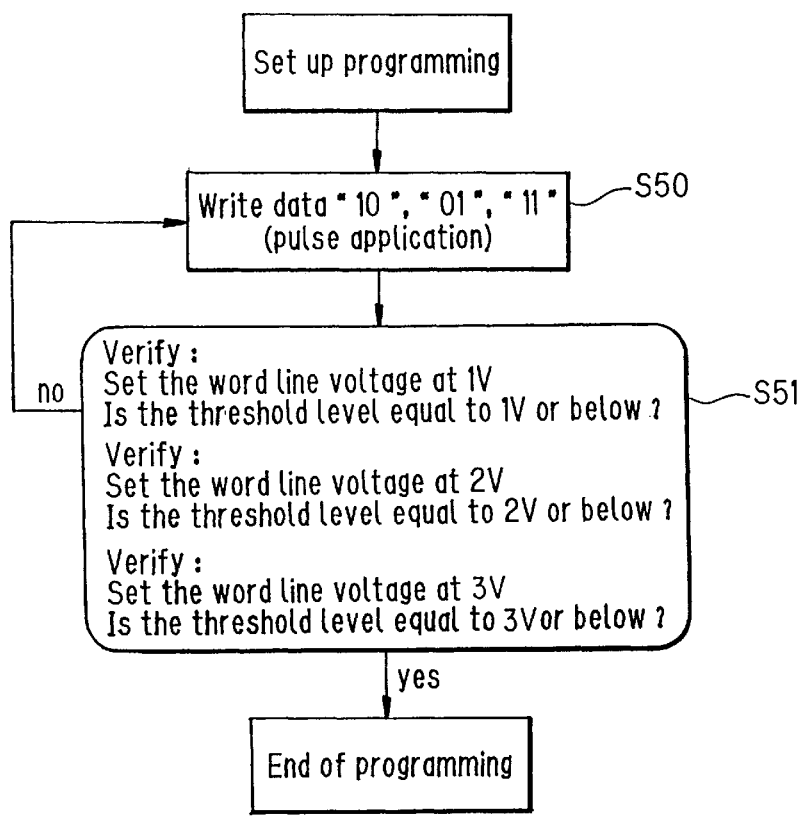
FIG. 16 is a flowchart of a conventional multilevel programming method for an ACT type flash memory (a multilevel programming method for an FN-NOR type flash memory)

Since the levels are not set up in sequential order like the first embodiment, the time for the threshold level of each cell M to become stabilized differs from others depending upon individual cell's programming characteristics. Therefore, the amount of reduction of the widening of the threshold levels becomes less compared to the technique of the first embodiment in which the threshold levels are set up taking into account the total current I01 involving roundabout current Ir (corresponding to FIG. 18). However, since the data '11' which has the greatest level difference from the erased state is determined first, the variation of roundabout current Ir becomes smaller compared to that from the algorithm of the conventional method (FIG. 16). Therefore, when the total current I01 is introduced to perform the present technique, widening or shift of the threshold level even for the case of data '10' which has the greatest influence on its neighbors, will be suppressed to as low as 0.2 V.

On the other hand, widening toward the higher threshold side also occurs when the adjacent cells M have data '01' and '10' (not shown in the drawing, but an example is the case where the data in cell M03 in FIG. 19 is replaced with '10'). In this case, the shift of the threshold level to the higher side will be suppressed to as low as 0.1 V. Here, roundabout current Ij may be considered in the same way as Ir, so the description will not be repeated.

Thus, when writing of multilevel data to the ACT type flash memory is effected following the above method of the second embodiment, the spread of the distribution of the threshold level of cell M02 having data '01' can be limited to within the range of 0.7 V wide from 2.4 V to 3.1 V, which is an improvement compared to the conventional programming method (based on the algorithm shown in FIG. 16) where the spread of the threshold level was within the range of 1 V wide from 2.2 V to 3.2 V.

As shown in FIG. 10, the readout voltage 2 based on which data '01' and '10', for example, are distinguished is set at 2.3 V, so that no mis-reading of cell M will occur.

Here, description has been made as to the threshold level for data '01', but other threshold levels produce similar widening.

Here, description has been made as to the programming technique in which data '11' which has the greatest difference in its charge amount in floating gate 102 from that in the erased state is written in first and then other states of data are written in at almost the same time. Also in a technique wherein a level of data other than '11' which has a large difference in its charge amount in the floating gate from that in the erased state is written in beforehand, it is readily assumed that reduction in widening of the threshold (compared to the widening of the threshold level obtained based on the conventional algorithm shown in FIG. 16) can be realized.

As has been described heretofore, in accordance with the features of the invention, it is possible to reduce the widening of the distribution of the threshold levels due to programming (programming with verification), which results from virtual ground type array configurations such as an ACT type flash memory. Therefore, the present invention can provide a wide reading margin, thus making it possible to realize a highly reliable multilevel flash memory.

Further, it is also possible to provide a wide reading margin while reducing the time for multilevel programming.

What is claimed is:

1. A programming method for a virtual ground type nonvolatile semiconductor memory comprising: a number of electrically data-programmable, erasable floating gate field effect transistors that are memory cells, each having a control gate, drain and source with a floating gate, arranged matrix-wise in rows and columns; a plurality of row lines, each connecting the control gates of memory cells located in one row; and a plurality of column lines, each commonly connecting the drain of the memory cell and the source of its adjacent memory cell, these memory cells constituting columns respectively, forming a virtual ground type array wherein each memory cell is adapted to have three or more number of storage states so as to store multilevel data by differentiating the amount of charge on the floating gate, the programming method being characterized in that the memory cells are programmed starting sequentially in the order of degree of the difference in charge amount in the floating gate from the erased state.

2. A programming method for a virtual ground type nonvolatile semiconductor memory comprising: a number of electrically data-programmable, erasable floating gate field effect transistors that are memory cells, each having a control gate, drain and source with a floating gate, arranged matrix-wise in rows and columns; a plurality of row lines, each connecting the control gates of memory cells located in one row; and a plurality of column lines, each commonly connecting the drain of the memory cell and the source of its adjacent memory cell, these memory cells constituting columns respectively, forming a virtual ground type array wherein each memory cell is adapted to have four or more number of storage states so as to store multilevel data by differentiating the amount of charge on the floating gate, the programming method being characterized in that the memory cells are programmed in such a manner that programmed states which produce the greater difference in charge amount in the floating gate from the erased state are written in first and then the other programmed states between the state having said greater difference and the erased state are simultaneously written in.

3. The programming method for a nonvolatile semiconductor memory according to claim 2, wherein the memory cells are programmed in such a manner that the programmed state which produces the greatest difference in charge amount in the floating gate from the erased state is written in first and then the other programmed states are simultaneously written in.

4. The programming method for a nonvolatile semiconductor memory according to any one of claims 1, 2 and 3, wherein the threshold level of readout voltage for the erased state in the nonvolatile semiconductor memory is higher than the threshold level of readout voltage for the programmed state.

5. The programming method for a nonvolatile semiconductor memory according to any one of claims 1, 2 and 3, wherein the threshold level of readout voltage for the erased state in the nonvolatile semiconductor memory is equal to or greater than 3.0 V while the lowest threshold level of readout voltage for the programmed state falls within the range between 0.5 V and 1.5 V.

6. The programming method for a nonvolatile semiconductor memory according to any one of claims 1, 2 and 3, wherein the threshold level of readout voltage for the erased state in the nonvolatile semiconductor memory is higher than the threshold level of readout voltage for the programmed state and the threshold level of readout voltage for the erased state in nonvolatile semiconductor memory is equal to or greater than 3.0 V while the lowest threshold level of readout voltage for the programmed state falls within the range between 0.5 V and 1.5 V.

* * * * *